(12) United States Patent
Paillet et al.

(10) Patent No.: US 9,046,552 B2
(45) Date of Patent: Jun. 2, 2015

(54) ON-DIE TRIM-ABLE PASSIVE COMPONENTS FOR HIGH VOLUME MANUFACTURING

(71) Applicants: Fabrice Paillet, Hillsboro, OR (US); Gerhard Schrom, Hillsboro, OR (US); Alexander Lyakhov, Haifa (IL); George L. Geannopoulos, Portland, OR (US); Ravi Sankar Vunnam, Hillsboro, OR (US); J. Keith Hodgson, Hillsboro, OR (US)

(72) Inventors: Fabrice Paillet, Hillsboro, OR (US); Gerhard Schrom, Hillsboro, OR (US); Alexander Lyakhov, Haifa (IL); George L. Geannopoulos, Portland, OR (US); Ravi Sankar Vunnam, Hillsboro, OR (US); J. Keith Hodgson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/929,727

(22) Filed: Jun. 27, 2013

(65) Prior Publication Data
US 2014/0266486 A1 Sep. 18, 2014

Related U.S. Application Data

(60) Provisional application No. 61/799,833, filed on Mar. 15, 2013, provisional application No. 61/829,992, filed on May 31, 2013.

(51) Int. Cl.
*H03B 5/20* (2006.01)
*G01R 19/00* (2006.01)
*H02M 3/157* (2006.01)
*H03L 5/00* (2006.01)
*H03M 1/66* (2006.01)
*G06T 3/40* (2006.01)
*H02M 3/156* (2006.01)
*H03M 1/68* (2006.01)

(52) U.S. Cl.
CPC ........... *G01R 19/0092* (2013.01); *H02M 3/157* (2013.01); *H03L 5/00* (2013.01); *H03M 1/66* (2013.01); *G06T 3/40* (2013.01); *H03M 1/685* (2013.01); *H02M 3/156* (2013.01); *H02M 2003/1566* (2013.01)

(58) Field of Classification Search
USPC .............................................. 331/135, 177 V
See application file for complete search history.

(56) References Cited

U.S. PATENT DOCUMENTS 7,385,453 B2 *  6/2008  Nervegna ....................... 331/176
2002/0171497 A1 * 11/2002  Forbes ............................ 331/57

\* cited by examiner

*Primary Examiner* — Joseph Chang
(74) *Attorney, Agent, or Firm* — Blakely, Sokoloff, Taylor & Zafman LLP

(57) ABSTRACT

Described is an apparatus to trim on-die passive components. The apparatus comprises: a resistor-capacitor (RC) dominated oscillator independent of first order transistor speed dependency, wherein the RC dominated oscillator including one or more resistors and capacitors with programmable resistance and capacitance, and wherein the RC dominated oscillator to generate an output signal having a frequency depending substantially on values of the programmable resistance and capacitance; and a trim-able resistor or capacitor operable to be trimmed, for compensating process variations, according to a program code associated with the programmable resistance and capacitance of the RC dominated oscillator.

20 Claims, 11 Drawing Sheets

US 9,046,552 B2

ON-DIE TRIM-ABLE PASSIVE COMPONENTS FOR HIGH VOLUME MANUFACTURING

CLAIM OF PRIORITY

This application claims the benefit of priority of U.S. Provisional Application 61/799,833 filed Mar. 15, 2013, titled "Integrated Voltage Regulators," and U.S. Provisional Application, 61/829,992 filed May 31, 2013 titled "On-Chip Compensator for an Integrated Voltage Regulator," which are incorporated by reference in their entirety.

BACKGROUND

To manufacture in high-volume complex analog features such as Voltage Regulators (VRs), a constant performance is expected to be delivered in presence of silicon process variations on devices and passive components. Passive components include inductors, resistors, and capacitors. These passive components vary in characteristics over dies on the same wafer. For example, a resistance of a passive resistor may vary four times between different dies. Such variation negatively impacts performance of these complex analog circuits.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
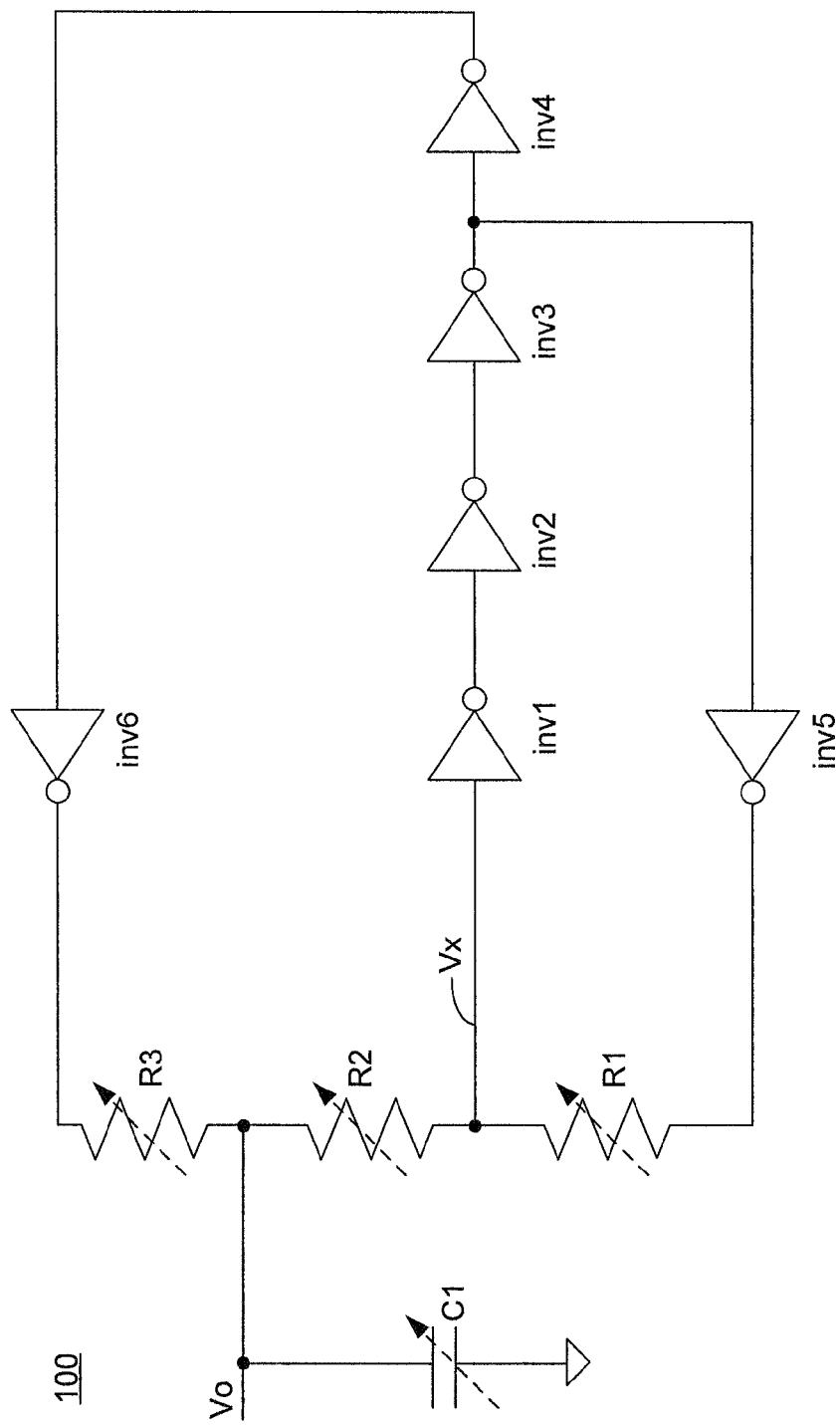
FIG. 1A is an RC (resistor-capacitor) dominated oscillator used for determining trim code for trim-able passive devices, according to one embodiment of the disclosure.

To keep circuits dynamically programmable with known performance levels in presence of silicon process variation a method and apparatus to normalize passive component performance is described. The embodiments describe a method and apparatus to implement programmable passives with normalized die to die performance using a novel scheme of RC passive trimming, where 'R' is resistance and 'C' is capacitance.

To provide constant performance in presence of silicon process variation where R and C can both vary by as much as +/−40%, the passive elements used in analog circuits (e.g., voltage regulators) are built using trim-able passives, according to one embodiment. In one embodiment, the values for R and C can be trimmed to a normalized RC product. In cases where circuits must in addition retain the capability to be programmed with variable yet normalized time constants, in one embodiment, those circuits the passive values can be selected in an independent manner to the trim setting which normalizes the value of the passives across dies.

For example a nominally targeted 10KΩ resistor could end up displaying a 6KΩ or a 14KΩ resistance from die to die in the same or different wafers. In one embodiment, a resistor is implemented with segments that can be added or deducted from the nominal value. In one embodiment, the trim settings of the resistor configure the number of added or deducted segments to the resistor depending if the final resistance value needs to be increased or decreased. In one embodiment, the resistor value can vary from 0.6× to 1.4× the typical process value.

In one embodiment, capacitors are built with a value that can be trimmed. The number of bits allocated to trim the resistors and capacitors depend on the accuracy of the correction required. In one embodiment, a total of 4 bits are used to trim the passives. In other embodiments, other number of bits may be used to trim the passives.

To find the trim settings needed to correct for process variations, in one embodiment, an RC dominated oscillator is used. The oscillation frequency of this oscillator is known by design for the typical process value of the passive used. In one embodiment, the trim settings are determined by comparing the oscillation frequency of this oscillator to an external frequency reference. In one embodiment, the oscillator switching frequency is set by the absolute RC product value and will increase and/or decrease as the trim settings are changed. In one embodiment, a trim FSM (Finite State Machine) steps through the trim input settings of the passive elements until its frequency matches the reference frequency source (e.g., 100 MHZ).

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1A is an RC dominated oscillator 100 used for determining trim code for trim-able passive devices, according to one embodiment of the disclosure. In one embodiment, the RC dominated oscillator 100 is independent of transistor speed and process variation i.e., the oscillator frequency is substantially determined by the passive devices—R and C. For example, the transistors used in the RC dominated oscillator 100 contribute zero or substantially zero first order dependency on transistor speed. The RC dominated oscillator 100 is one such example of an oscillator. Other oscillators with zero or substantially zero first order dependency on transistor speed may be used by coupling passive devices (Rs and Cs) with the transistors.

In one embodiment, RC dominated oscillator 100 comprises a variable capacitor C1, variable resistors R1, R2, and R3, inverters inv1, inv2, inv3, inv4, inv5, and inv6. In one embodiment, for RC dominated oscillator 100 to oscillate, voltage on node Vx reaches the trip point of inverter inv1. In one embodiment, R1=Rt.k, R2=Rt.(1−k), and R3=Rs. In one embodiment, for oscillation frequency of 100 MHz, C1=3.12 pF, k=0.778, Rs=2277Ω, Rt=16025Ω. In other embodiments, other values may be used to achieve a target oscillator frequency.

In one embodiment, each or some of the passive devices in the RC dominated oscillator 100 are trim-able. In this example, 7 bits are used to trim capacitor C1. In one embodiment, node Vo provides the output of RC dominated oscillator 100. In one embodiment, RC time constant of RC dominated oscillator 100 determines the oscillation frequency, where the RC time constant is directly related to the resistance and capacitances of R1, R2, R3, and C1. In one embodiment, for a desired target oscillation frequency of RC dominated oscillator 100, the resistors and capacitor(s) are trimmed (for process variations). In one embodiment, the trimming bits are used to determine a program code for trimming other passive devices in the die.

Figure 1B:
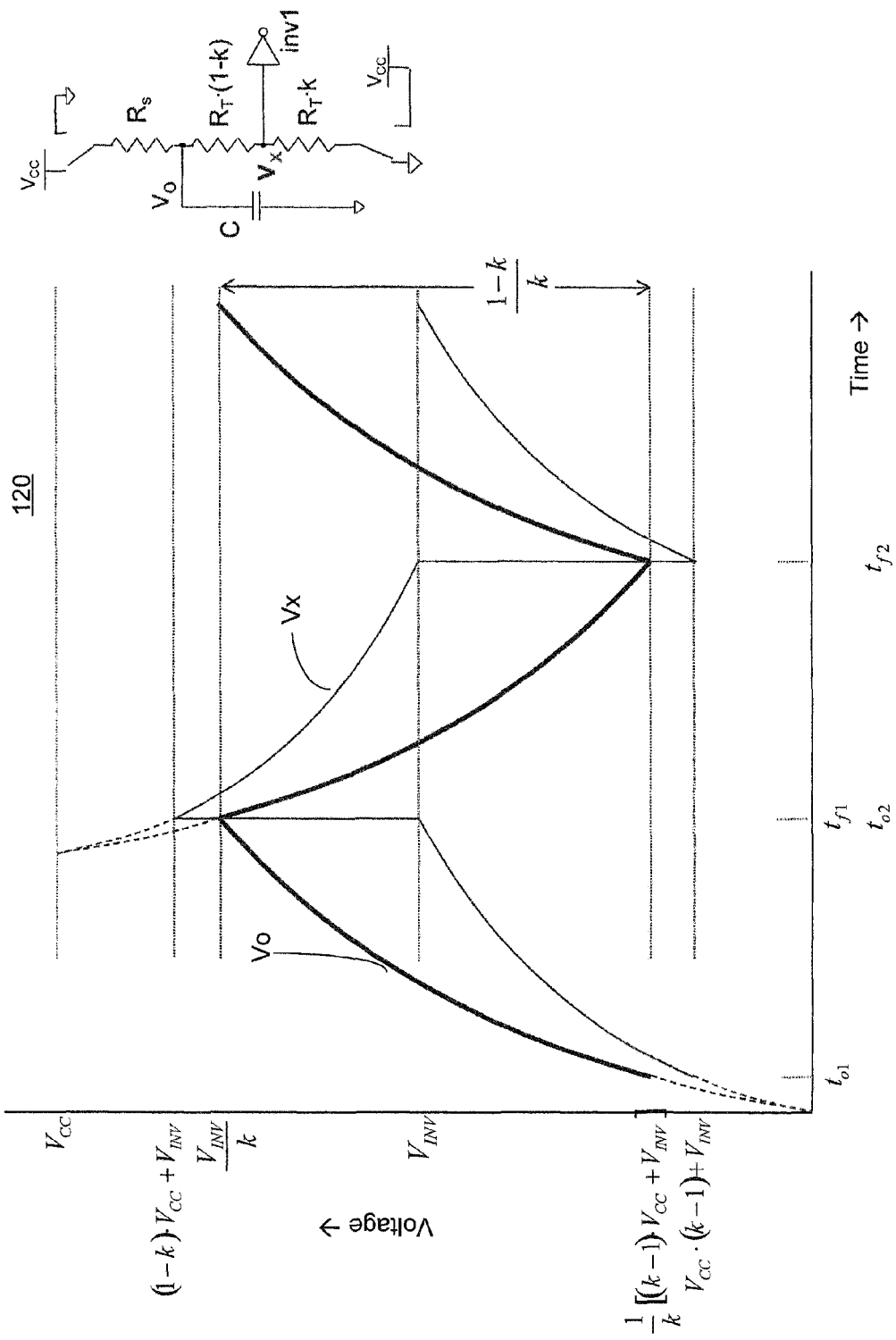
FIG. 1B is a plot with waveforms generated by the RC dominated oscillator used for determining trim code for trim-able passive devices, according to one embodiment of the disclosure.

FIG. 1B is a plot 120 with waveforms generated by RC dominated oscillator 100 used for determining trim code for trim-able passive devices, according to one embodiment of the disclosure. It is pointed out that those elements of FIG. 1B having the same reference numbers (or names) as the elements of any other figure can operate or function in any manner similar to that described, but are not limited to such.

The x-axis is time and y-axis is voltage. Plot 120 shows two waveforms, voltages on nodes Vx and Vo. Part of RC dominated oscillator 100 is shown on the right side of plot 120. $V_{INV}$ represents the trip-point of inverter inv1. As discussed with reference to FIG. 1, R1=Rt.k, R2=Rt.(1−k), and R3=Rs, where:

$$0 < k < 1$$

$$X = \frac{R_T}{R_T + R_S}$$

$$R_O = R_S \| R_T$$

$$\tau = R_O C$$

$$t_{o1} = -\tau \cdot \ln\left[1 - \frac{(k-1) \cdot V_{CC} + V_{INV}}{k \cdot X \cdot V_{CC}}\right]$$

$$t_{o2} = -\tau \cdot \ln\left[1 - \left(\frac{1}{X} - \frac{V_{INV}}{k \cdot X \cdot V_{CC}}\right)\right]$$

$$t_{f2} = -\tau \cdot \ln\left[1 - \frac{k \cdot V_{CC} - [(k-1) \cdot V_{CC} + V_{INV}]}{K \cdot X \cdot V_{CC}}\right]$$

$$T_{osc} = (t_{f1} - t_{o1}) + (t_{f2} - t_{o2})$$

In one embodiment, if $V_{INV}=0.5 \cdot V_{CC}$ then:

$$t_{o1} = t_{o2}$$

$$t_{f1} = t_{f2}$$

where $1/T_{OSC}$ is the oscillating frequency of RC dominated oscillator 100.

Figure 1C:
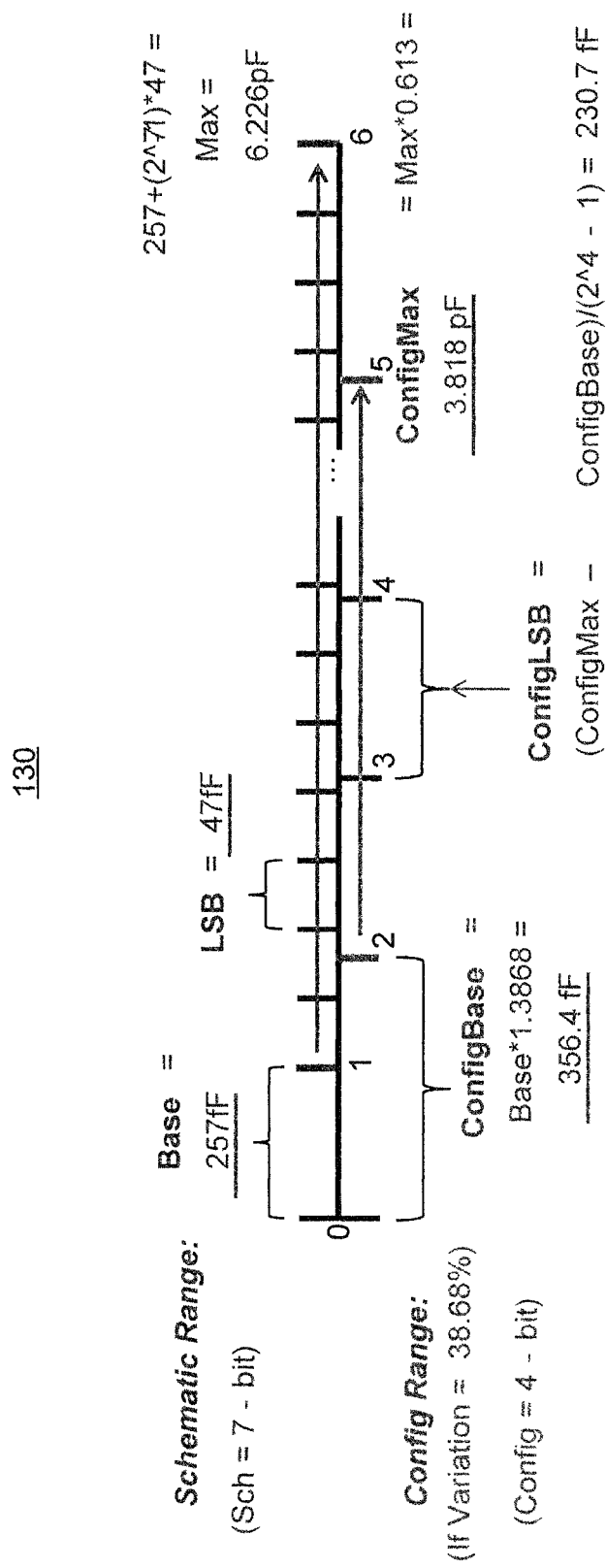
FIG. 1C illustrates how a finely adjustable binary capacitor is used to select a desired capacitance in spite of process variations, according to one embodiment of the disclosure.

FIG. 1C illustrates an example of code 130 for capacitor C1 of FIG. 1A, according to one embodiment of the disclosure. It is pointed out that those elements of FIG. 1C having the same reference numbers (or names) as the elements of any other figure can operate or function in any manner similar to that described, but are not limited to such.

In this example, 7 binary bits are used to configure actual capacitance of capacitor C1 of FIG. 1A. As capacitance of C1 increases, the frequency of oscillation reduces until it crosses a reference frequency. In one embodiment, variation in the binary code required to hit this target frequency is a direct indication of RC product deviation from the expected value.

Figure 2:
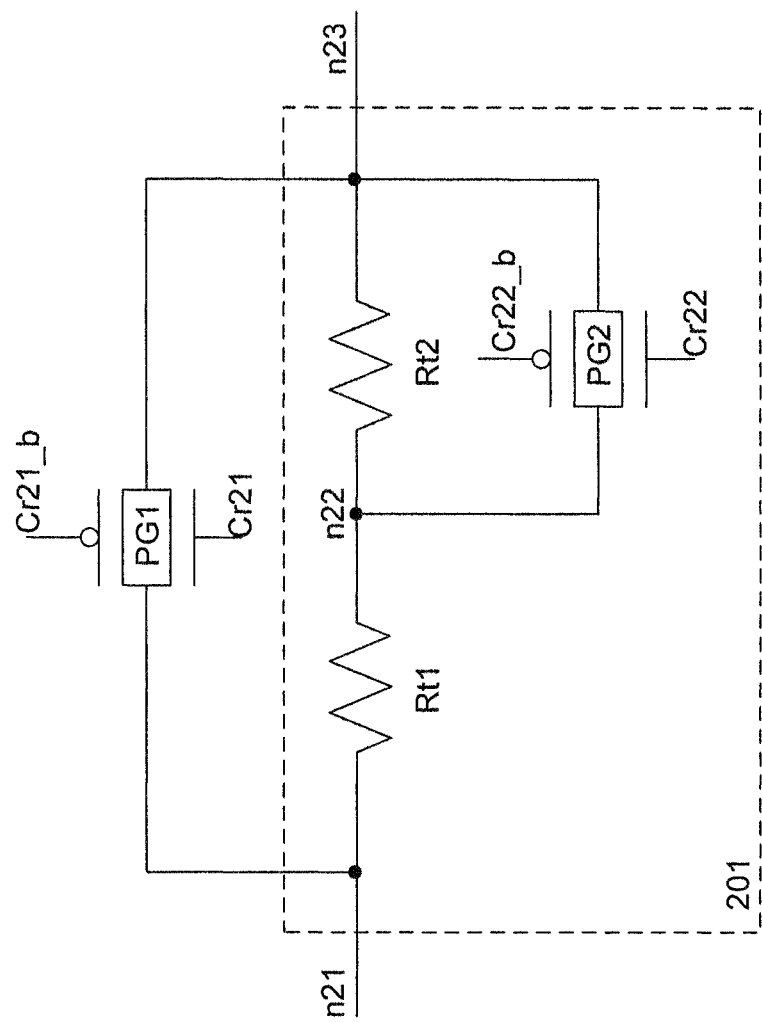
FIG. 2 is a resistor with trim-able resistor unit cell, according to one embodiment of the disclosure.

FIG. 2 is a resistor 200 with trim-able resistor unit cell 201, according to one embodiment of the disclosure. It is pointed out that those elements of FIG. 2 having the same reference numbers (or names) as the elements of any other figure can operate or function in any manner similar to that described, but are not limited to such.

In one embodiment, resistor 200 comprises a first pass gate PG1. In one embodiment, PG1 is operable (via control signals Cr21 and C21_b, where Cr21_b is inverse of Cr21) to short nodes n21 and n23 or keep them un-shorted. In one embodiment, unit cell 201 comprises first resistor Rt1, second resistor Rt2, and second pass gate PG2. In one embodiment, second pass gate PG2 is operable (via control signals Cr22 and C22_b, where Cr22_b is inverse of Cr22) to short nodes n22 and n23 or keep them un-shorted. In one embodiment, PG2 is used to trim the resistance of resistor 200 while PG1 is used to program nominal value of the resistor.

In this example, when PG1 is turned on, the nominal value of resistor 200 is zero ohms, and when PG1 is turned off then the nominal value of resistor 200 is either Rt1+Rt2 or Rt1 (depending on whether PG2 is on or off). In this embodiment, resistor 200 is trim-able by one bit (because of one pass gate in PG2) and programmable to a nominal value by one bit (because of one pass gate in PG1). In one embodiment, resistors R1, R2, and R3 of RC dominated oscillator 100 have the same resistor as resistor 200. In one embodiment, the trimming code for trimming R1, R2, and R3 are used (directly or indirectly e.g., by using a lookup table and/or formula) for trimming resistor 200 via PG2.

Figure 3:
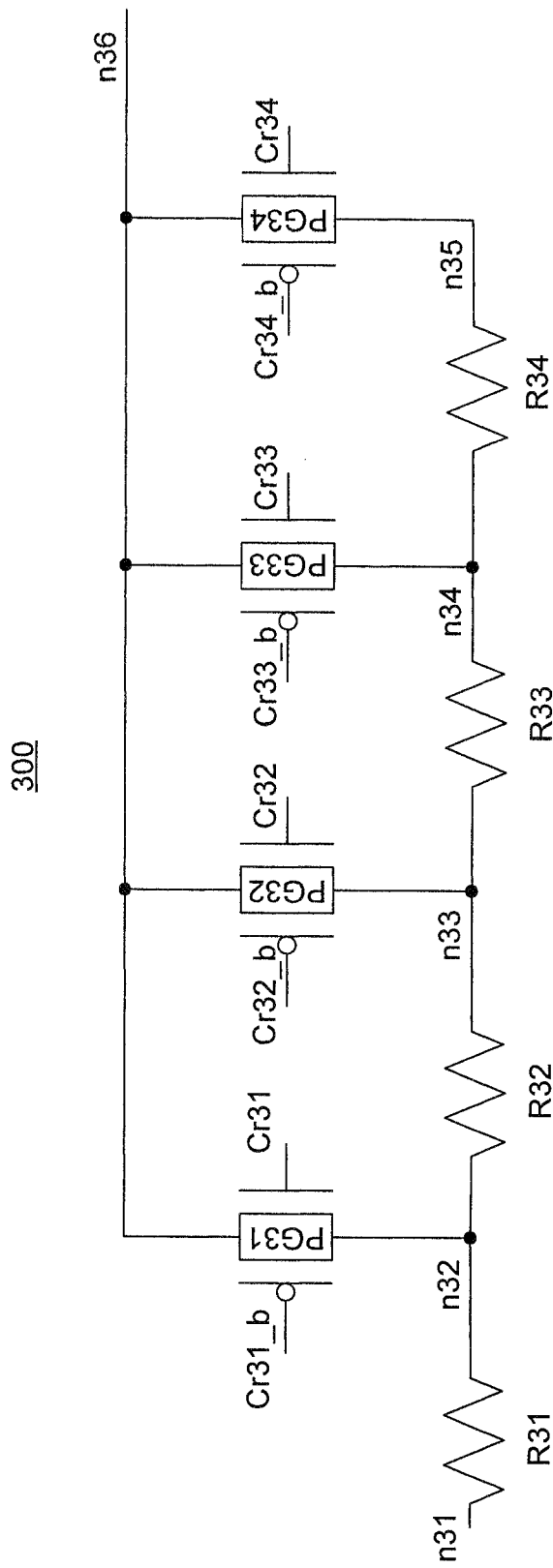
FIG. 3 is a trim-able resistor, according to another embodiment of the disclosure.

FIG. 3 is a trim-able resistor 300, according to another embodiment of the disclosure. In this embodiment, trim-able resistor 300 has first terminal n31 and second terminal n36. The exemplary embodiment of trim-able resistor 300 is a 2-bit trim-able resistor (with 4-to-1-decoder), where the two bits are used for controlling pass-gates. For example, pass-gate PG31 is controllable by trim signal Cr31 (and its inverse bit Cr31_b), pass-gate PG32 is controllable by trim signal Cr32 (and its inverse bit Cr32_b), pass-gate PG33 is controllable by trim signal Cr33 (and its inverse bit Cr33_b), and pass-gate PG34 is controllable by trim signal Cr34 (and its inverse bit Cr34_b). In other embodiments, other number of trim-able bits may be used. In one embodiment, the trim signals are decoded trim bits either using a decoder or a look-up table.

In one embodiment, a unit cell of the trim-able resistor 300 comprises a resistor coupled to a pass-gate. For example, resistor R31 coupled to pass-gate PG31 forms a first unit cell, R32 coupled to pass-gate PG32 forms a second unit cell, R33 coupled to pass-gate PG33 forms a third unit cell, and R34 coupled to pass-gate PG34 forms a fourth unit cell. In this embodiment, PG31 is coupled to node n36 and n32, PG32 is coupled to node n36 and n33, PG33 is coupled to n36 and n34, and PG34 is coupled to n36 and n35. In one embodiment, resistors R1, R2, and R3 of RC dominated oscillator 100 use the same trim-able resistor 300. In one embodiment, trimming code(s) used for R1, R2, and R3 of RC dominated oscillator 100 are also applied to pass-gates PG31, PG32, PG33, and PG34.

Figure 4:
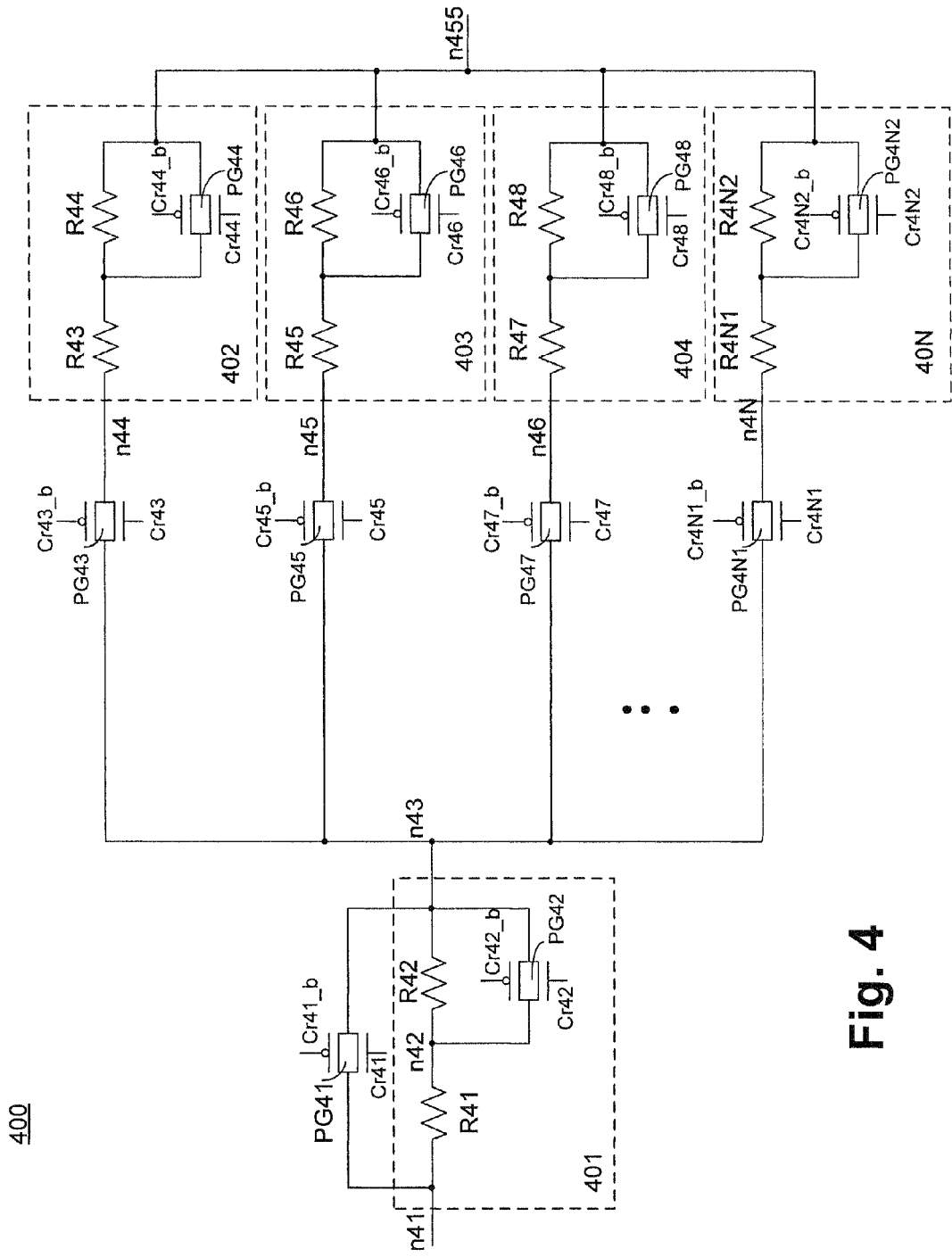
FIG. 4 is a trim-able resistor with programmable resistance, according to one embodiment of the disclosure.

FIG. 4 is a trim-able resistor 400 with programmable resistance, according to one embodiment of the disclosure. In this embodiment, first terminal of trim-able resistor 400 is node n41 and second terminal of trim-able resistor 400 is node n455. In one embodiment, trim-able resistor 400 comprises unit cells 401, 402, 403, 404, and 40N, where 'N' is an integer greater than 4. In one embodiment, each unit cell is similar to the unit cell 201 of FIG. 2.

Referring back to FIG. 4, in one embodiment, resistors R1, R2, and R3 of RC dominated oscillator 100 use the same trim-able resistor unit cell 401. In one embodiment, trimming code(s) used for R1, R2, and R3 of RC dominated oscillator 100 are also applied (directly or indirectly e.g., by using a lookup table and/or formula) to pass-gates of the unit cells 401, 402, 403, 404, and 40N i.e., PG42, PG44, PG46, PG48, and PG4N2. In such an embodiment, control signals to the pass gates are the same i.e., Cr42 (and Cr42_b which is inverse of Cr42), Cr44 (and Cr44_b which is inverse of Cr44), Cr46 (and Cr46_b which is inverse of Cr46), Cr48 (and Cr48_b which is inverse of Cr48), and Cr4N2 (and Cr4N2_b which is inverse of CrN2) are controlled by the same signal.

In one embodiment, to program a nominal value for resistor 400, pass-gates PG41 (coupled between nodes n41 and n43), PG43 (coupled between nodes n43 and n44), PG45 (coupled between nodes n43 and n45), PG47 (coupled between nodes n43 and n46), and PG4N1 (coupled between nodes n43 and node n4N) are used, where 'N' is a number greater than 6. In one embodiment, control signals to the pass gates are different and are used for adjusting a nominal value for resistor 400 i.e., Cr41 (and Cr41_b which is inverse of Cr41), Cr43 (and Cr43_b which is inverse of Cr43), Cr45 (and Cr45_b which is inverse of Cr45), Cr47 (and Cr47_b which is inverse of Cr47), and Cr4N1 (and Cr4N1_b which is inverse of Cr4N1) are controlled by different signals.

Figure 5:
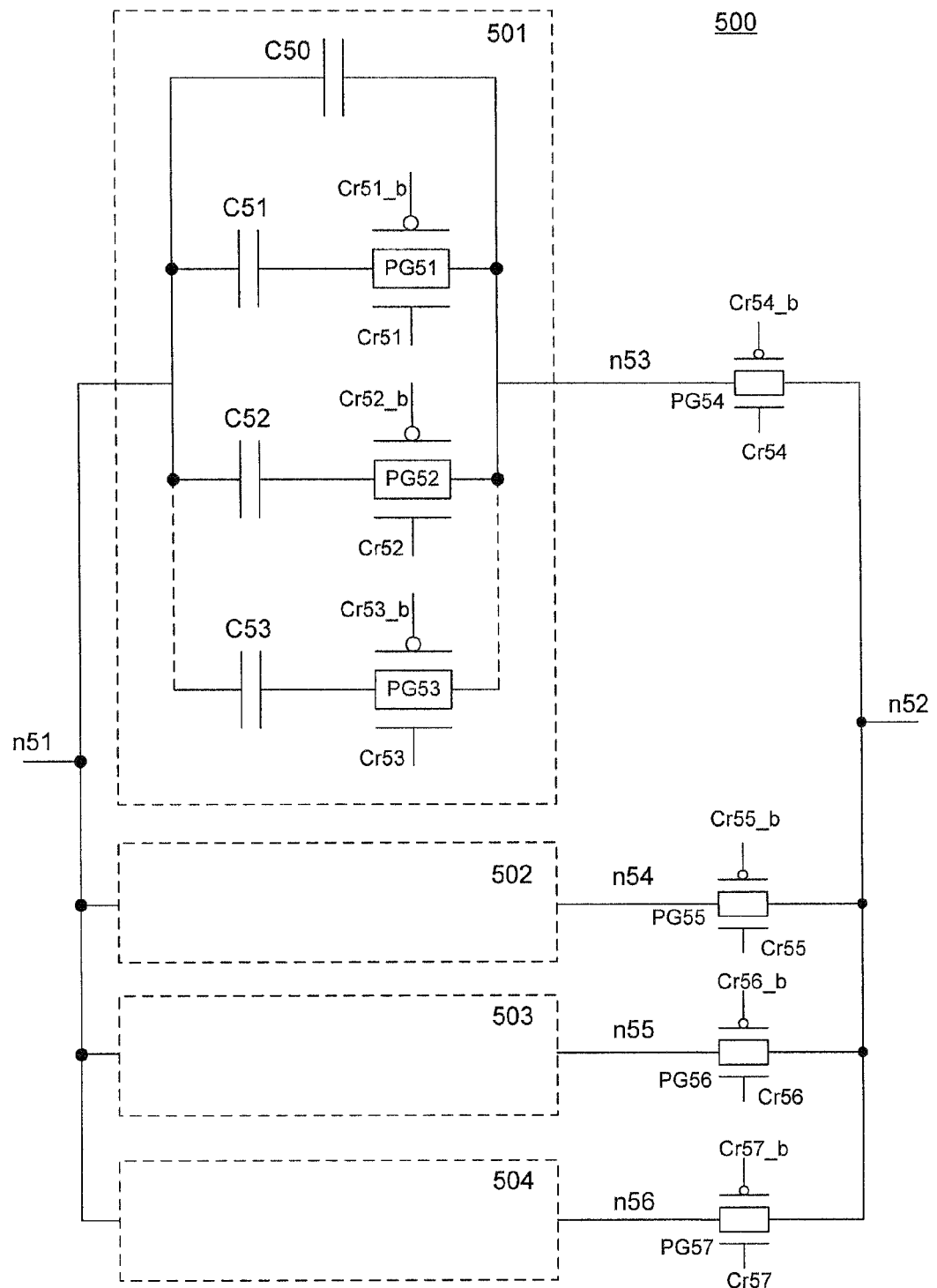
FIG. 5 is a trim-able capacitor with programmable capacitance, according to one embodiment of the disclosure.

FIG. 5 is a trim-able capacitor 500 with programmable capacitance, according to one embodiment of the disclosure. The first terminal of trim-able capacitor 500 is n41 and the second terminal is n52. In one embodiment, trim-able capacitor 500 comprises unit cells 501-504. In other embodiments, other number of unit cells may be used. So as not to obscure the embodiments, unit cell 501 is described. The same description applies to other units cells i.e., 502-504.

In one embodiment, unit cell 501 comprises capacitor C50 to provide a base capacitance, capacitor 51 is coupled to pass-gate PG51, capacitor 52 is coupled to pass-gate PG52, and capacitor 53 is coupled to pass-gate PG53. In this embodiment, unit cell 501 is a 3-bit trim-able unit cell using the three pass-gates. In other embodiments, other number of trim-able bits may be used. In one embodiment, capacitor C50 is coupled to nodes n51 and n53.

In one embodiment, pass-gate PG51 is controllable by signals Cr51 and Cr51_b (where Cr51_b is inverse of Cr51) and is operable to couple capacitor C51 to node n53 so that capacitor C51 is parallel to capacitor C50. In one embodiment, pass-gate PG52 is controllable by signals Cr52 and Cr52_b (where Cr52_b is inverse of Cr52) and is operable to couple capacitor C52 to node n53 so that capacitor C52 is parallel to capacitor C50. In one embodiment, pass-gate PG53 is controllable by signals Cr53 and Cr53_b (where Cr53_b is inverse of Cr53) and is operable to couple capacitor C53 to node n53 so that capacitor C53 is parallel to capacitor C50. In one embodiment, other unit cells (i.e., unit cells 502, 503, and 504) have their pass-gates controllable by same signals as pass-gates of unit cell 501. In this embodiment, the signals used for controlling pass-gates PG51, PG52, and PG53 trim the trim-able capacitor for process variations. In one embodiment, these signals are associated with the program code (also called trim code) obtained from RC dominated oscillator 100.

In one embodiment, capacitors C51, C52, and C53 are binary weighted. In another embodiment, capacitors C51, C52, and C53 are thermometer weighted. In one embodiment, pass-gates PG51, PG52, and PG53 are sized proportionally to the size of the capacitors they are coupled to. For example, size of pass-gates PG51, PG52, and PG53 is also binary weighted when capacitors C51, C52, and C53 are binary weighted.

In one embodiment, trim-able capacitor 500 comprises pass-gate PG54 coupled between nodes n53 and n52, pass-gate PG55 coupled between nodes n54 and n52, pass-gate PG56 coupled between nodes n55 and n52, and pass-gate PG57 coupled between nodes n56 and n52. In this embodiment, pass-gates PG54, PG55, PG56, and PG57 are used for programming nominal value of the trim-able capacitor 500.

In one embodiment, pass-gate PG54 is controlled by signals Cr54 and Cr54_b (where Cr54_b is inverse of Cr54) to couple or uncouple unit cell 501 to node n52. In one embodiment, pass-gate PG55 is controlled by signals Cr55 and Cr55_b (where Cr55_b is inverse of Cr55) to couple or uncouple unit cell 502 to node n52. In one embodiment, pass-gate PG56 is controlled by signals Cr56 and Cr56_b (where Cr56_b is inverse of Cr56) to couple or uncouple unit cell 503 to node n52. In one embodiment, pass-gate PG57 is controlled by signals Cr57 and Cr57_b (where Cr57_b is inverse of Cr57) to couple or uncouple unit cell 504 to node n52.

Figure 6:
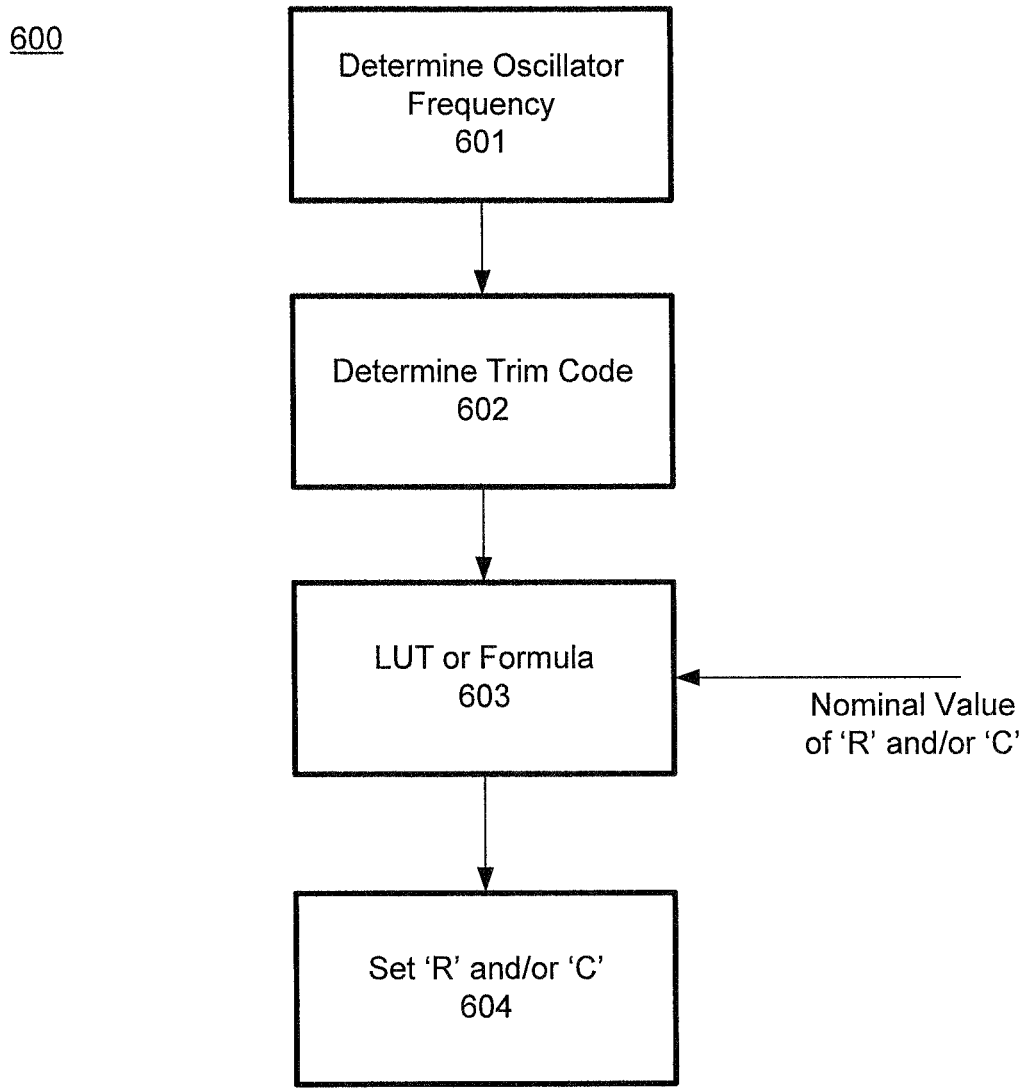
FIG. 6 is a flowchart for trimming passive devices, according to one embodiment of the disclosure.

FIG. 6 is a flowchart 600 for trimming passive devices, according to one embodiment of the disclosure. It is pointed out that those elements of FIG. 6 having the same reference numbers (or names) as the elements of any other figure can operate or function in any manner similar to that described, but are not limited to such.

Although the blocks in the flowcharts with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 are optional in accordance with certain embodiments. The numbering of the blocks presented is for the sake of clarity and is not intended to prescribe an order of operations in which the various blocks must occur. Additionally, operations from the various flows may be utilized in a variety of combinations.

In one embodiment, at block 601, a target oscillator frequency is determined for RC dominated oscillator 100. In one embodiment, different dies have the same RC dominated oscillator 100. At block 602, trim code is determined which is associated with the Rs and Cs of RC dominated oscillator 100 to achieve the target oscillator frequency. In one embodiment, trim code is determined for other RC dominated oscillators 100 in other dies to achieve the same target frequency. As discussed in the background section, since resistances and capacitances of resistors and capacitors differ (e.g., as much as 4x) between dies, trim codes for the RC dominated oscillators 100 for different dies are also different to achieve the same target oscillation frequency. In one embodiment, the trim code for the RC dominated oscillator is determined by a tester as described with reference to FIG. 7.

Referring back to FIG. 6, at block 603, the trim code (associated with the RC dominated oscillator 100) and the desired nominal value for Rs and Cs is input to a formula or a lookup table (LUT) to determine a program code for trimming Rs and Cs of the trim-able resistor (e.g., trim-able resistor 200, 300, 400) and/or capacitor (e.g., trim-able capacitor 500). One such LUT and/or formula is described with reference to FIG. 7.

Referring back to FIG. 6, at block 604, the program code for trimming Rs and Cs of the trim-able resistor (e.g., trim-able resistor 200, 300, 400) and/or capacitor (e.g., trim-able capacitor 500) is applied to compensate for process variations.

In one embodiment, method 600 works in a loop, where at each pass the oscillator frequency is compared to a reference frequency and, depending on whether the oscillator is faster or slower, the trim code is incremented or decremented to reduce or increase the oscillator frequency to get it closer to the reference (much like an analog to digital converter).

Program software code/instructions associated with flowchart 600 executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software."

The program software code/instructions associated with flowchart 600 typically include one or more instructions stored at various times in various tangible memory and storage devices in or peripheral to the computing device, that, when fetched/read and executed by the computing device, as defined herein, cause a computing device to perform functions, functionalities, and operations necessary to perform a method, so as to execute elements involving various aspects of the function, functionalities, and operations of the method(s) forming an aspect of the disclosed subject matter.

For the purposes of this disclosure a module is a software, hardware, or firmware (or combinations thereof) system, process or functionality, or component thereof, that performs or facilitates the processes, features, and/or functions, functionalities, and/or operations described herein (with or without human interaction or augmentation) as being performed by the identified module. A module can include sub-modules. Software components of a module may be stored on a tangible machine readable medium. Modules may be integral to one or more servers, or be loaded and executed by one or more servers. One or more modules may be grouped into an engine or an application.

A tangible machine readable medium can be used to store program software code/instructions and data that, when executed by a computing device, cause the computing device to perform a method(s) as may be recited in one or more accompanying claims directed to the disclosed subject matter. The tangible machine readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in a same communication session.

The software program code/instructions and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

Figure 8:
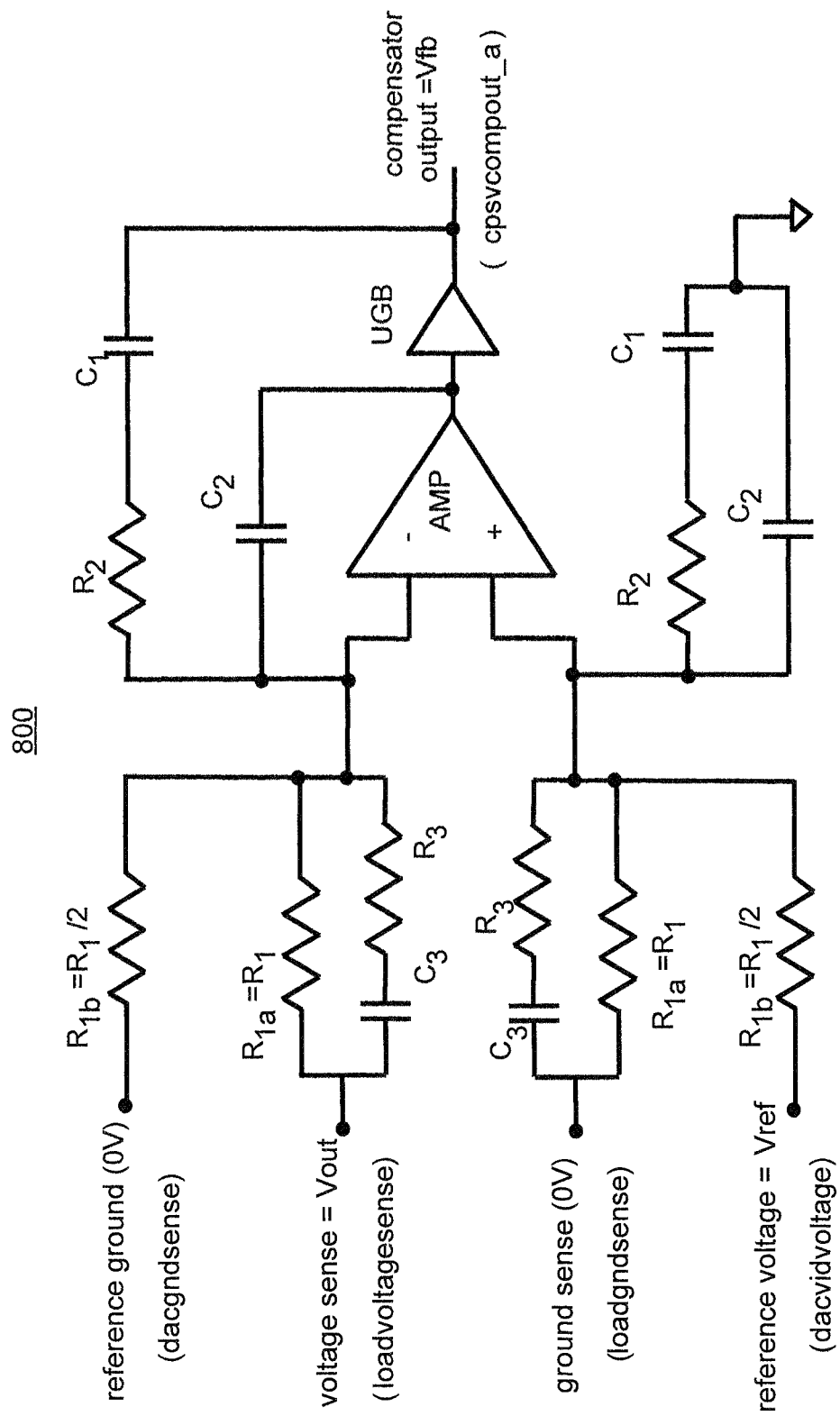
FIG. 8 is a compensator with trim-able passive devices which are trimmed using the RC configuration flow of FIG. 7, according to one embodiment.

In general, a tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Blackberry® Droid®, or the like, or any other device including a computing device. In one embodiment, processor-based system (e.g., as shown in FIG. 8) is in a form of or included within a PDA, a cellular phone, a notebook computer, a tablet, a game console, a set top box, an embedded system, a TV, a personal desktop computer, etc. Alternatively, the traditional communication applications and subsidized application(s) may be used in some embodiments of the disclosed subject matter.

Figure 7:
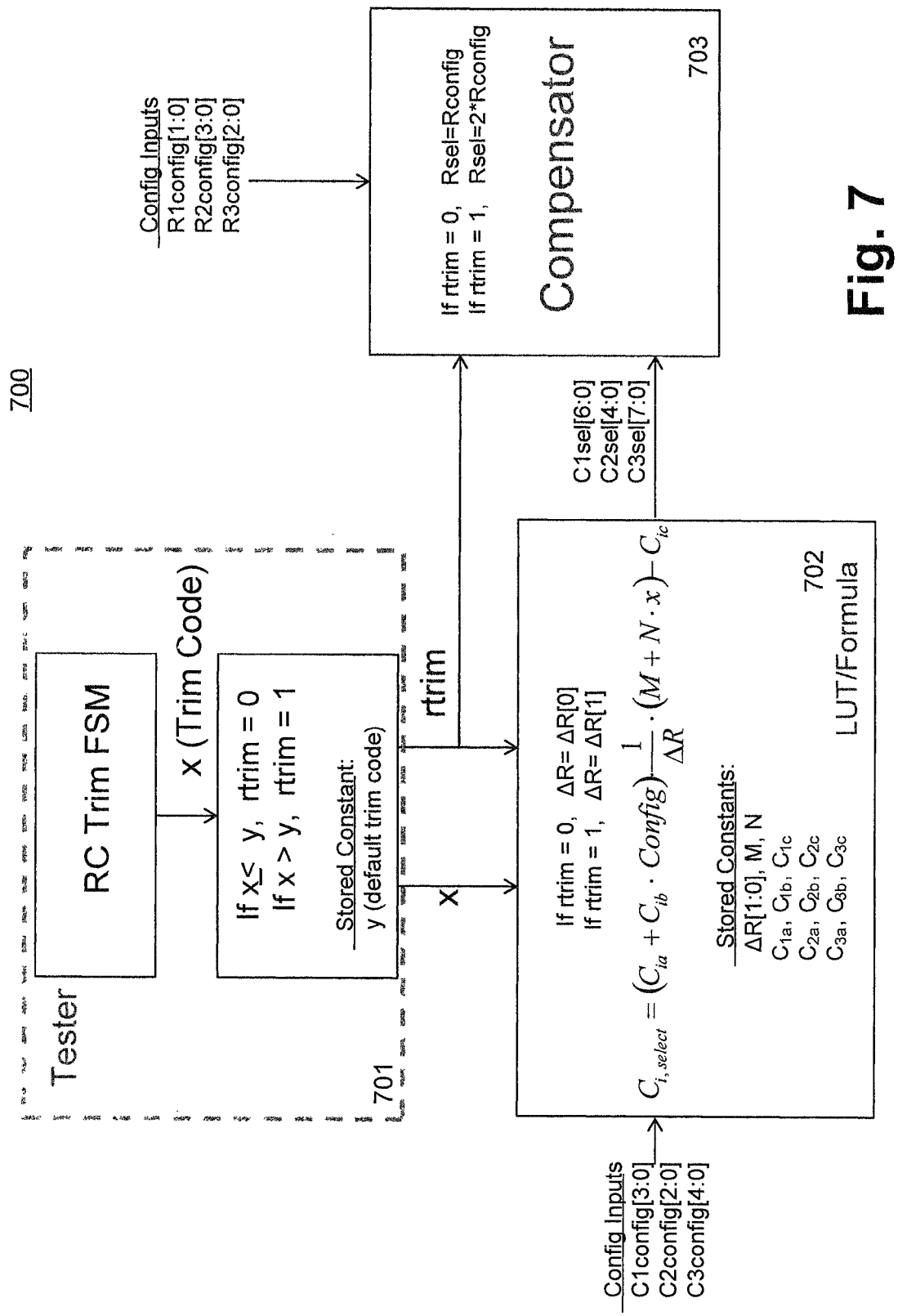
FIG. 7 is an RC configuration flow using a lookup table (LUT) and/or formula to trim capacitor and resistor of a circuit (e.g., compensator of a voltage regulator) using code from the RC dominated oscillator of FIG. 1A, according to one embodiment of the disclosure.

FIG. 7 is an RC configuration flow 700 using a lookup table (LUT) and/or formula to trim capacitor and resistor of a circuit (e.g., compensator of a voltage regulator) using code from RC dominated oscillator 100 of FIG. 1A, according to one embodiment of the disclosure. It is pointed out that those elements of FIG. 7 having the same reference numbers (or names) as the elements of any other figure can operate or function in any manner similar to that described, but are not limited to such.

In one embodiment, a tester 701 generates a trim code 'x' for the resistors of the RC dominated oscillator 100 using an RC Trim FSM (Finite State Machine). For example, RC Trim FSM increments through control bits to adjust resistance of resistors R1, R2, and/or R3 of FIG. 1A to achieve a target oscillating frequency at Vo. In one embodiment, trim code 'x' is compared with trim code 'y' to set value for variable "rtrim." Trim code 'y' is a trim code (also referred to default trim code) which the RC Trim FSM would generate if the RC product (which determines the target oscillating frequency of RC dominated Oscillator 100) were at the target value. In one embodiment, when the RC product is on target already (e.g., by accident), then the FSM lands up at the default trim code, i.e., RC does not need to be adjusted.

In one embodiment, trim code 'x' and variable "rtrim" are received by a LUT or formula for generating trim code for resistors and/or capacitors in the die. In one embodiment, the LUT and/or formula are managed and stored by a power control unit (PCU). In other embodiments, the LUT and/or formula are managed and stored by another logic unit. In one embodiment, PCU 702 receives Configuration Inputs—C1config[3:0], C2config[2:0], C3config[4:0], where C1config, C2config, and C3config are the target values (or nominal values) for some of the compensator passives.

Referring to capacitor C1 of FIG. 1A and FIG. 1C, in one embodiment, the following constants are saved in the LUT of PCU 702.

$$C_{1a} = 356.4/47 = 7.584$$

$$C_{1b} = 230.7/47 = 4.909$$

$$C_{1c} = 257/47 = 5.4681$$

Where:
a=ConfigBase/LSB,
b=ConfigLSB/LSB,
c=Base/LSB.
Here, Base and LSB are the nominal schematic values of the always-connected base capacitor and the LSB of the binary selectable capacitor; ConfigBase and ConfigLSB are capacitance values that a designer intends to target using the circuit containing Base and LSB capacitors. In one embodiment, an arbitrary capacitance value can be achieved with Base and LSB in spite of process variation because the design knows what the process variation is from the result of the RC Trim FSM. In one embodiment, ConfigBase and ConfigLSB are larger (i.e. coarser) than Base and LSB, respectively.

In one embodiment, to compute a select code (i.e., trimable bits for a passive device), following trim constants are stored by PCU 702 in a storage medium (e.g., ROM):

$$M = \frac{\frac{C_{1,BASE}}{C_{1,LSB}}}{\frac{C_{1,BASE}}{C_{1,LSB}} + y}$$

$$N = \frac{1}{\frac{C_{1,BASE}}{C_{1,LSB}} + y}$$

$$\Delta R[i], i \in \{0, 1\}$$

$$\frac{1}{\Delta R[i]}, i \in \{0, 1\}$$

Where, $\Delta R$ is the factor by which the nominal resistor value is modified after the RC Trim result is known. For example, $\Delta R[0]=\text{sqrt}(2)$ and $\Delta R[1]=1/\text{sqrt}(2)$. In this example, R[0] is always equal to 2× R[1]. In one embodiment, index T is selected based on whether the RC Trim result is larger or smaller than the target code.

Continuing with the example, assume idea trim code 'y'=55 and actual trim code is 'x.' 'M' and 'N' are then determined as:

$$M = \frac{\frac{257}{47}}{\frac{257}{47} + 55}$$
$$= 0.09043$$

$$N = \frac{1}{\frac{257}{47} + 55}$$
$$= 0.01654$$

Where, 'M' and 'N' are constants derived from structure of capacitor C1 of FIG. 1A and nominal trim code.
PCU 702 then stores:
M=0.09043,
N=0.01654,
$\Delta R[0]$=0.7071,
$\Delta R[1]$=1.414.
In one embodiment, the following rtrim values are saved or fused: if 'x' is less or equal to 'y,' then rtrim=0, if 'x' greater than 'y' then rtrim=1. Continuing with the example, the following $\Delta R$s are calculated by PCU 702: if rtrim=0, then $\Delta R=\Delta R[0]$, and if rtrim=1, then $\Delta R=\Delta R[1]$. In one embodiment, the formula for computing $C_{select}$ is given as:

$$C_{select} = (C_a + C_b \cdot Config) \cdot \frac{1}{\Delta R} \cdot (M + N \cdot x) - C_c$$

Continuing with the RC Configuration Flow 700, the rtrim value, Cselect values (for trimming capacitors), and R config values (for trimming resistors) are used to trim the capacitors and resistors of a circuit having resistors and capacitors. In this exemplary embodiment, the circuit is a compensator 703 used in a voltage regulator.

FIG. 8 illustrates an exemplary embodiment of compensator circuit 800 (same as 703, and also called differential type-3 compensator) which includes trim-able passive devices which are trimmed according to the embodiments discussed.

In one embodiment, differential type-3 compensator 800 comprises a differential amplifier (AMP), passive resistors with values R1$a$, R1$b$, duplicate passive resistors R2 and R3, duplicate passive capacitors C1, C2, and C3, and unity gate buffer (UGB). In one embodiment, UGB is optional. In one embodiment, R1$b$=R1/2 and R1$a$=R1.

In one embodiment, differential inputs (signal and ground) for Vout and Vref are received by the passive devices and eventually as inputs to the differential amplifier. The term "dacgrndsense" refers to the ground node near a Digital to Analog Converter using a voltage regulator. The term "loadvolagesense" refers to node Vout near the load of the voltage regulator. The term "loadgndsense" refers to ground node near the load. The term "dacvidvoltage" refers to reference voltage Vref.

In one embodiment, the resistor network comprises passive resistors with values R1$a$ and R1$b$ such that Vout=Vref×R1$a$/R1$b$. In one embodiment, (R1$a$/R1$b$)=2 to support conditions when Vout is greater than Vccags, where Vccags is an analog power supply. In other embodiments, other ratios for R1$a$/R1$b$ may be used.

In one embodiment, duplicate passive devices (i.e., R2, R3, C1, C2, and C3) are coupled together as shown in FIG. 8. In one embodiment, the coupling of the duplicate passive devices is such that the frequency response (i.e., of Vout/Vfb) is preserved. In one embodiment, the coupling of the duplicate passive devices is such that any common-mode noise on voltage_sense/ground_sense or reference_voltage/reference_ground nodes is canceled.

In one embodiment, the coupling of the duplicate passive devices is such that any substrate or supply noise coupled through passives' parasitic into the amplifier (AMP) positive and negative inputs is approximately identical, so that it has no net (or substantially zero net) effect on Vfb. In one embodiment, the passive devices are trimmed to ensure that any RC time constant is approximately on target in spite of process variation e.g., systematic process variation.

In one embodiment, UGB is used to reduce the capacitive load on the amplifier output. In such an embodiment, a single-stage amplifier design can be used for the differential amplifier to preserve phase margin. In one embodiment, a multi-instance design of the amplifier with gated output stage is used, so that the compensator bandwidth can be configured to reduce power consumption.

Referring back to FIG. 7, Cselect includes C1sel[6:0], C2sel[4:0], and C3sel[7:0], which are provided by PCU 702 to compensator 703. R configuration values includes R1config[1:0], R2config[3:0], and R3config[2:0]. The Rsel value depends on rtrim. If rtrim=0, Rsel=Rconfig, and if rtrim=1, Rsel=2×Rconfig, where Rsel is "$\Delta R[i]$" as discussed with reference to FIG. 7.

Figure 9:
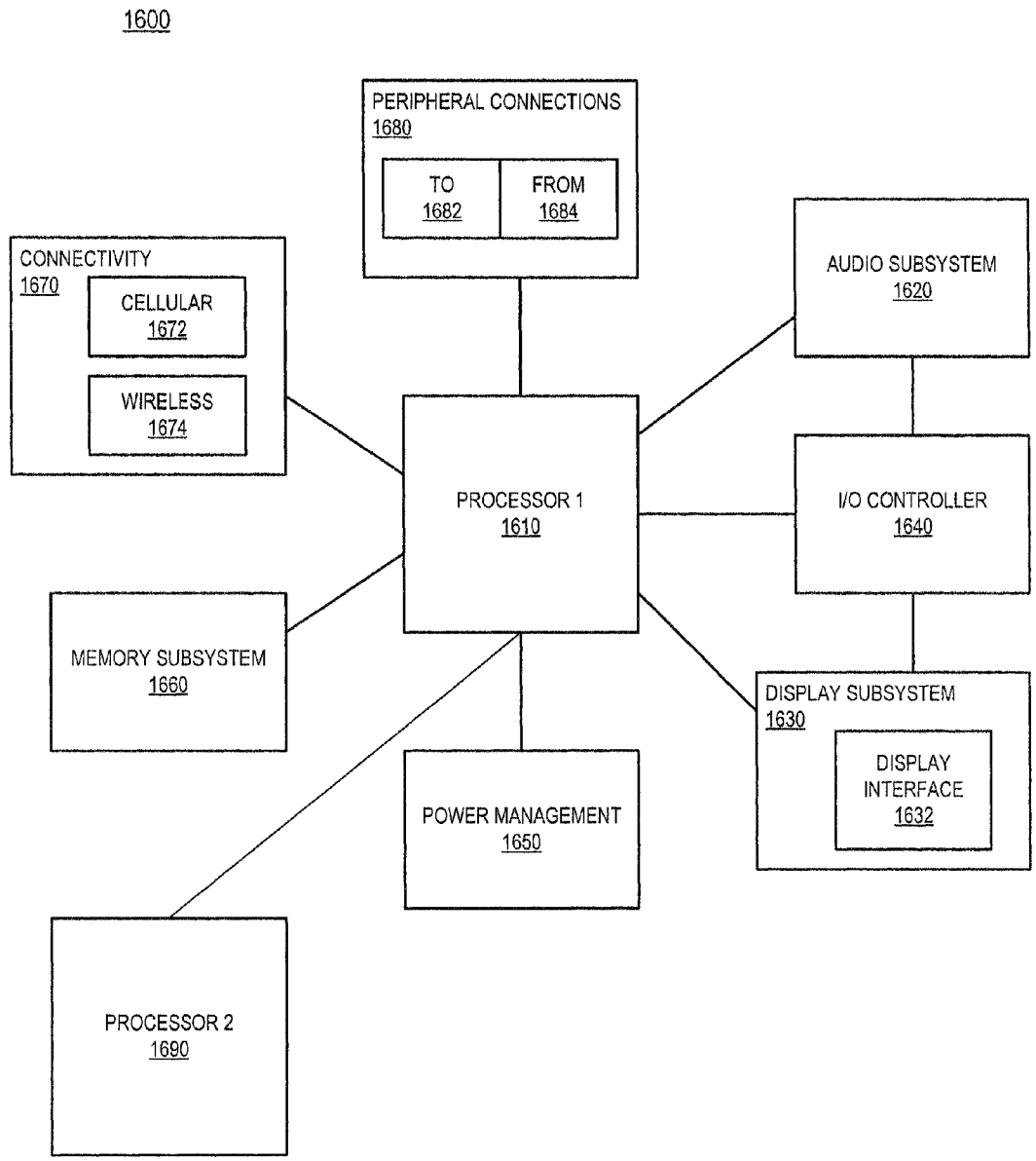
FIG. 9 is a smart device or a computer system or an SoC (system-on-chip) with trim-able passive devices and apparatus/method for trimming the passives, according to one embodiment of the disclosure.

FIG. 9 is a smart device or a computer system or an SoC (system-on-chip) with trim-able passive devices and apparatus and method for trimming those passive devices, according to one embodiment of the disclosure. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with trim-able passive devices, according to the embodiments discussed. Other blocks of the computing device 1600 may also include the trim-able passive devices of the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a resistor-capacitor (RC) dominated oscillator independent of first order transistor speed dependency, wherein the RC dominated oscillator including one or more resistors and capacitors with programmable resistance and capacitance, and wherein the RC dominated oscillator to generate an output signal having a frequency depending substantially on values of the programmable resistance and capacitance; and a trim-able resistor or capacitor operable to be trimmed, for compensating process variations, according to a program code associated with the programmable resistance and capacitance of the RC dominated oscillator.

In one embodiment, each resistor of the RC dominated oscillator comprises: a first resistor; a second resistor coupled in series with the first resistor; a first pass-gate operable to short the first and second resistors; and a second pass-gate operable to short the second resistor. In one embodiment, the first pass-gate is controllable by one or more signals associated with the program code. In one embodiment, the trim-able resistor comprises a unit cell, the unit cell including: a first resistor; a second resistor coupled in series with the first resistor; and a pass-gate operable to short the second resistor.

In one embodiment, the pass-gate is controllable by one or more signals associated with the program code. In one embodiment, the trim-able resistor comprises a unit cell, the unit cell including: a resistor; and a pass-gate operable to couple the resistor with another component. In one embodiment, the pass-gate is controllable by one or more signals associated with the program code. In one embodiment, each capacitor of the RC dominated oscillator comprises: a first capacitor; and a plurality of capacitors operable to be coupled in parallel to the first capacitor via a corresponding plurality of pass-gates, and wherein the plurality of pass-gates are controllable by one or more signals associated with the program code.

In one embodiment, the trim-able capacitor comprises a unit cell, the unit cell including: a first capacitor; and a plurality of capacitors operable to be coupled in parallel to the first capacitor via a corresponding plurality of pass-gates, and wherein the plurality of pass-gates are controllable by one or more signals associated with the program code. In one embodiment, the apparatus further comprises a lookup table (LUT) to translate the program code to a code for trimming the trim-able resistor or capacitor. In one embodiment, further comprises a storage medium having instructions thereon that when executed cause a logic to translate the program code to a code for trimming the trim-able resistor or capacitor. In one embodiment, the trim-able resistor or capacitor are part of a voltage regulator.

In another example, in one embodiment, a method comprises: determining a target frequency; operating a resistor-capacitor (RC) dominated oscillator independent of first order transistor speed dependency to achieve the target frequency, wherein the RC dominated oscillator including one or more resistors and capacitors with programmable resistance and capacitance, and wherein the RC dominated oscillator to generate an output signal having the target frequency depending substantially on values of the programmable resistance and capacitance; and trimming a trim-able resistor or capacitor, for compensating process variations, according to a program code corresponding to the target frequency, the program code associated with the programmable resistance and capacitance of the RC dominated oscillator.

In one embodiment, the trim-able resistor comprises: a first resistor; a second resistor coupled in series with the first resistor; and a pass-gate operable to short the second resistor. In one embodiment, the method further comprises controlling the pass-gate by one or more signals associated with the program code. In one embodiment, the method further comprises translating the program code to a code for trimming the trim-able resistor or capacitor using a lookup table (LUT).

In another example, in one embodiment, a system comprises: a memory unit; a processor coupled to the memory unit, the processing including: a resistor-capacitor (RC) dominated oscillator independent of first order transistor speed dependency, wherein the RC dominated oscillator including one or more resistors and capacitors with programmable resistance and capacitance, and wherein the RC dominated oscillator to generate an output signal having a frequency depending substantially on values of the programmable resistance and capacitance; and a trim-able resistor or capacitor operable to be trimmed, for compensating process variations, according to a program code associated with the programmable resistance and capacitance of the RC dominated oscillator; and a wireless interface for allowing the processor to communicate with another device. In one embodiment, the trim-able resistor comprises a unit cell, the unit cell including: a first resistor; a second resistor coupled in series with the first resistor; and a pass-gate operable to short the second resistor, wherein the pass-gate is controllable by one or more signals associated with the program code.

In one embodiment, the trim-able capacitor comprises a unit cell, the unit cell including: a first capacitor; and a plurality of capacitors operable to be coupled in parallel to the first capacitor via a corresponding plurality of pass-gates, and wherein the plurality of pass-gates are controllable by one or more signals associated with the program code. In one embodiment, the system further comprises a display unit to display content processed by the processor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a resistor-capacitor (RC) dominated oscillator, wherein the RC dominated oscillator including one or more resistors and capacitors with programmable resistance and capacitance, and wherein the RC dominated oscillator to generate an output signal having a frequency depending substantially on values of the programmable resistance and capacitance, and wherein at least one value of the programmable resistance and capacitance is configured by a program code to achieve the frequency; and a trim-able resistor or capacitor operable to be trimmed, for compensating process variations, according to the program code associated with the programmable resistance and capacitance of the RC dominated oscillator.

2. The apparatus of claim 1, wherein each resistor of the RC dominated oscillator comprises:
a first resistor;
a second resistor coupled in series with the first resistor;
a first pass-gate operable to short the first and second resistors; and
a second pass-gate operable to short the second resistor.

3. The apparatus of claim 2, wherein the first pass-gate is controllable by one or more signals associated with the program code.

4. The apparatus of claim 1, wherein the trim-able resistor comprises a unit cell, the unit cell including:
a first resistor;
a second resistor coupled in series with the first resistor; and
a pass-gate operable to short the second resistor.

5. The apparatus of claim 4, wherein the pass-gate is controllable by one or more signals associated with the program code.

6. The apparatus of claim 1, wherein the trim-able resistor comprises a unit cell, the unit cell including:
a resistor; and
a pass-gate operable to couple the resistor with another component.

7. The apparatus of claim 6, wherein the pass-gate is controllable by one or more signals associated with the program code.

8. The apparatus of claim 1, wherein each capacitor of the RC dominated oscillator comprises:
a first capacitor; and
a plurality of capacitors operable to be coupled in parallel to the first capacitor via a corresponding plurality of pass-gates, and wherein the plurality of pass-gates are controllable by one or more signals associated with the program code.

9. The apparatus of claim 1, wherein the trim-able capacitor comprises a unit cell, the unit cell including:
a first capacitor; and
a plurality of capacitors operable to be coupled in parallel to the first capacitor via a corresponding plurality of pass-gates, and wherein the plurality of pass-gates are controllable by one or more signals associated with the program code.

10. The apparatus of claim 1 further comprises a lookup table (LUT) to translate the program code to a code for trimming the trim-able resistor or capacitor.

11. The apparatus of claim 1 further comprises a storage medium having instructions thereon that when executed cause a logic to translate the program code to a code for trimming the trim-able resistor or capacitor.

12. The apparatus of claim 1, wherein the trim-able resistor or capacitor are part of a voltage regulator.

13. A method comprising:
determining a target frequency;
operating a resistor-capacitor (RC) dominated oscillator to achieve the target frequency, wherein the RC dominated oscillator including one or more resistors and capacitors with programmable resistance and capacitance, and wherein the RC dominated oscillator to generate an output signal having the target frequency depending substantially on values of the programmable resistance and capacitance at least one of which is configured by a program code; and trimming a trim-able resistor or capacitor, for compensating process variations, according to the program code corresponding to the target frequency, the program code associated with the programmable resistance and capacitance of the RC dominated oscillator.

14. The method of claim 13, wherein the trim-able resistor comprises:
a first resistor;
a second resistor coupled in series with the first resistor; and
a pass-gate operable to short the second resistor.

15. The method of claim 14 further comprises controlling the pass-gate by one or more signals associated with the program code.

16. The method of claim 13 further comprises translating the program code to a code for trimming the trim-able resistor or capacitor using a lookup table (LUT).

17. A system comprising:
a memory unit;
a processor coupled to the memory unit, the processing including:
a resistor-capacitor (RC) dominated oscillator, wherein the RC dominated oscillator including one or more resistors and capacitors with programmable resistance and capacitance, and wherein the RC dominated oscillator to generate an output signal having a frequency depending substantially on values of the programmable resistance and capacitance, and wherein at least one value of the programmable resistance and capacitance is configured by a program code to achieve the frequency; and
a trim-able resistor or capacitor operable to be trimmed, for compensating process variations, according to the program code associated with the programmable resistance and capacitance of the RC dominated oscillator; and
a wireless interface for allowing the processor to communicate with another device.

18. The system of claim 17, wherein the trim-able resistor comprises a unit cell, the unit cell including:
a first resistor;
a second resistor coupled in series with the first resistor; and
a pass-gate operable to short the second resistor, wherein the pass-gate is controllable by one or more signals associated with the program code.

19. The system of claim 17, wherein the trim-able capacitor comprises a unit cell, the unit cell including:
a first capacitor; and
a plurality of capacitors operable to be coupled in parallel to the first capacitor via a corresponding plurality of pass-gates, and wherein the plurality of pass-gates are controllable by one or more signals associated with the program code.

20. The system of claim 17 further comprises a display unit to display content processed by the processor.

* * * * *